United States Patent
Kuhara

[19]

[11] Patent Number: 5,953,268
[45] Date of Patent: Sep. 14, 1999

[54] MEMORY BLOCK REPLACEMENT SYSTEM AND REPLACEMENT METHOD FOR A SEMICONDUCTOR MEMORY

[75] Inventor: Shigeru Kuhara, Tokyo, Japan

[73] Assignee: NEC Corporation, Tokyo, Japan

[21] Appl. No.: 09/137,240

[22] Filed: Aug. 20, 1998

[30] Foreign Application Priority Data

Aug. 20, 1997 [JP] Japan ..................................... 9-222873

[51] Int. Cl.⁶ .................................................. G11C 11/40
[52] U.S. Cl. ...................................... 365/200; 365/230.03
[58] Field of Search ............................. 365/200, 230.03, 365/218, 201; 371/10.1, 10.2, 10.3; 235/380, 382

[56] References Cited

U.S. PATENT DOCUMENTS

| | | | |
|---|---|---|---|
| 4,760,575 | 7/1988 | Watanabe | 371/21 |
| 5,483,491 | 1/1996 | Yoshioka et al. | 365/200 |
| 5,576,633 | 11/1996 | Roundtree et al. | 365/200 |
| 5,576,999 | 11/1996 | Kim et al. | 365/200 |

FOREIGN PATENT DOCUMENTS

| | | |
|---|---|---|
| 0 569 040 | 11/1993 | European Pat. Off. . |
| 0 778 584 | 6/1997 | European Pat. Off. . |
| 3-104097 | 5/1991 | Japan . |

*Primary Examiner*—Vu A. Le
*Attorney, Agent, or Firm*—Young & Thompson

[57] ABSTRACT

A semiconductor memory which is capable of enhancing its memory utilization efficiency and suppressing an increase in the memory area is provided. The semiconductor memory is equipped with a plurality of main memory blocks and a single redundancy memory block. A test ROM having a test program stored therein is stored in a portion of the redundancy memory block. If a defective memory cell is present in one of the main memory blocks, control means replaces this main memory block with the redundancy memory block. The test ROM is moved to an area within the main memory block in which the defective memory cell is not present.

16 Claims, 6 Drawing Sheets

MEMORY BLOCK REPLACEMENT SYSTEM AND REPLACEMENT METHOD FOR A SEMICONDUCTOR MEMORY

BACKGROUND OF THE INVENTION

1. Field of the Invention

The present invention relates to semiconductor memories, and more particularly to a memory block replacement system and replacement method for a semiconductor memory constituted by an electrically erasable and programmable read-only memory (EEPROM).

1. Description of the Related Art

In semiconductor memories, a reduction in the yield and an increase in the test cost are recently becoming an important problem, as the memory capacitance and the circuit scale are enlarged.

As a solution method for the reduction in yield, there is a method which enhances yield by replacing a defective memory with a redundancy memory. As one of the replacement methods there is a block switching method. This method is equipped with a redundancy memory block in addition to normal memory blocks. When a defective memory cell is present within a normal memory block, the defective memory block is replaced with a redundancy memory block. Since this method performs replacement at a block unit, it has the advantage that a circuit for replacement is structurally simple as compared with a method such as word line replacement, bit line replacement, etc.

As a solution method for the increase in test cost, there is a method in which a ROM incorporating a specific program therein is previously provided in circuitry. This specific program is used to confirm if memory or peripheral circuitry operates correctly. If this program is used, an efficient operational test will become possible and an increase in the test cost can be suppressed. Here, the ROM incorporating this specific program is referred to as the test ROM.

FIG. 6 shows a conventional semiconductor memory of the above kind. The semiconductor memory consists of main memory blocks 11 to 14, a redundancy memory block 10, a test ROM 15, and a control section 16 for controlling these.

Now, in the case where the main memory blocks 11 to 14 are normal, the redundancy memory block 10 is not used.

On the other hand, when a defective memory cell is present in any of the main memory blocks 11 to 14, the main memory block having the defective memory cell (any of 11 to 14) is exchanged for the redundancy memory block 10 by the control section 16.

The control section 16 also tests the main memory blocks 11 to 14, redundancy memory block 10, and other semiconductor memory circuits by employing a test program written within the test ROM 15.

Another semiconductor memory of the above type is described in Japanese Patent Application Laid-Open No. 3-104097. In the case where this semiconductor memory has a plurality of redundancy circuits, when there is a defect in one redundancy circuit, the semiconductor memory causes the one redundancy circuit to be in an unusable state.

However, in the method of providing a redundancy memory block, even when only one portion in a memory block, for example, a single memory cell is defective, the block is replaced for relief. For this reason, although the other memory cells within the block operate correctly, they are not used and therefore there is a disadvantage that the memory utilization efficiency is low.

Also, providing the test ROM results in an increase in the memory area, and furthermore, in the case where a defective memory is present within the test ROM, there is a disadvantage that there is no relief means.

Moreover, the semiconductor memory of the aforementioned Japanese Patent Application Laid-Open No. 3-104097 does not describe a means of overcoming this disadvantage.

SUMMARY OF THE INVENTION

It is an object of the present invention to provide a semiconductor memory which is capable of enhancing its memory utilization efficiency and also suppressing an increase in the memory area.

To achieve this end, there is provided a memory block replacement system for a semiconductor memory comprising: a main memory block; a redundancy memory block; a specific program written to a certain area within the redundancy memory block; and control means for replacing the main memory block with the redundancy memory block.

The aforementioned object of the present invention is also achieved by a memory block replacement method for a semiconductor memory comprising a main memory block, a redundancy memory block, and a specific program written to a certain area within the redundancy memory block, the memory block replacement method including a first process of replacing the main memory block with the redundancy memory block.

According to the memory block replacement system of the present invention and the memory block replacement method for the semiconductor memory of the present invention, a specific program is stored in the redundancy memory block, so that an increase in the area occupied by the memory can be suppressed. In addition, since the specific program is moved to another area in the main memory block in which no defective memory cell is present, the memory utilization efficiency can be enhanced.

BRIEF DESCRIPTION OF THE DRAWINGS

The above and other objects and advantages will become apparent from the following detailed description when read in conjunction with the accompanying drawings wherein.

DESCRIPTION OF THE PREFERRED EMBODIMENT

Figure 1:
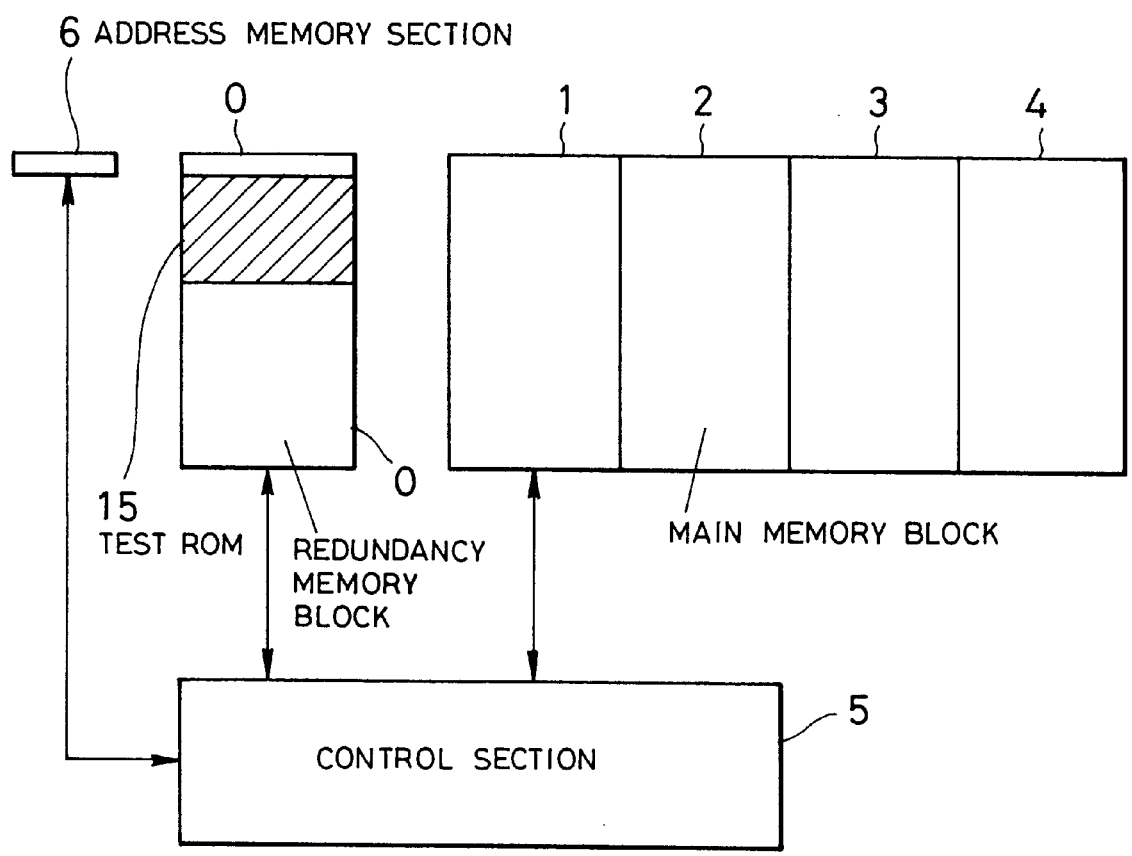
FIG. 1 is a block diagram of the best embodiment of a semiconductor memory according to the present invention.
Figure 6:
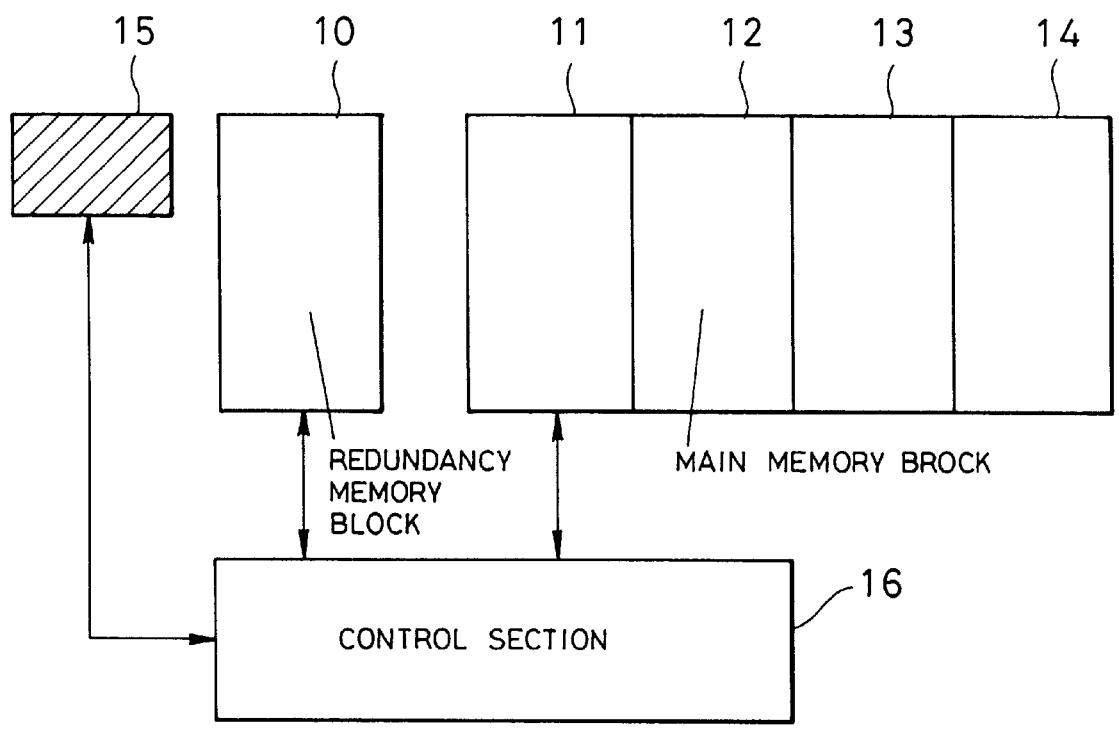
FIG. 6 is a block diagram of a conventional semiconductor memory.

An embodiment of the present invention will hereinafter be described in reference to the accompanying drawings. FIG. 1 is a block diagram of the best embodiment of a semiconductor memory according to the present invention. The same reference numerals will be applied to the same parts as the conventional example (FIG. 6) and therefore a description thereof will not be given.

The semiconductor memory consists of main memory blocks 1 to 4, a redundancy memory block 0, a test ROM 15, an address memory section 6 for holding an address of a test program stored in the test ROM 15, and a control section 5 for controlling these.

These memory blocks 1 to 4 and 0 can be constituted by a readable/writable RAM, but in this embodiment they are constituted by non-volatile memory.

The contents of the test program in the test ROM 15 are written from the outside after semiconductor chip fabrication. This embodiment has the advantage that the contents can be freely changed, because these memory blocks are constituted by non-volatile memory. The memory size of the test ROM 15 is smaller than any of the main memory blocks 0, 1, 2, 3, and 4.

When there is no defective memory cell in any of the main memory blocks 1 to 4, replacement of the redundancy memory block 0 and the main memory blocks 1 to 4 is not performed. At this time, the test ROM 15 is located within the redundancy memory block 0, and the address is held by the address memory section 6.

Figure 2:
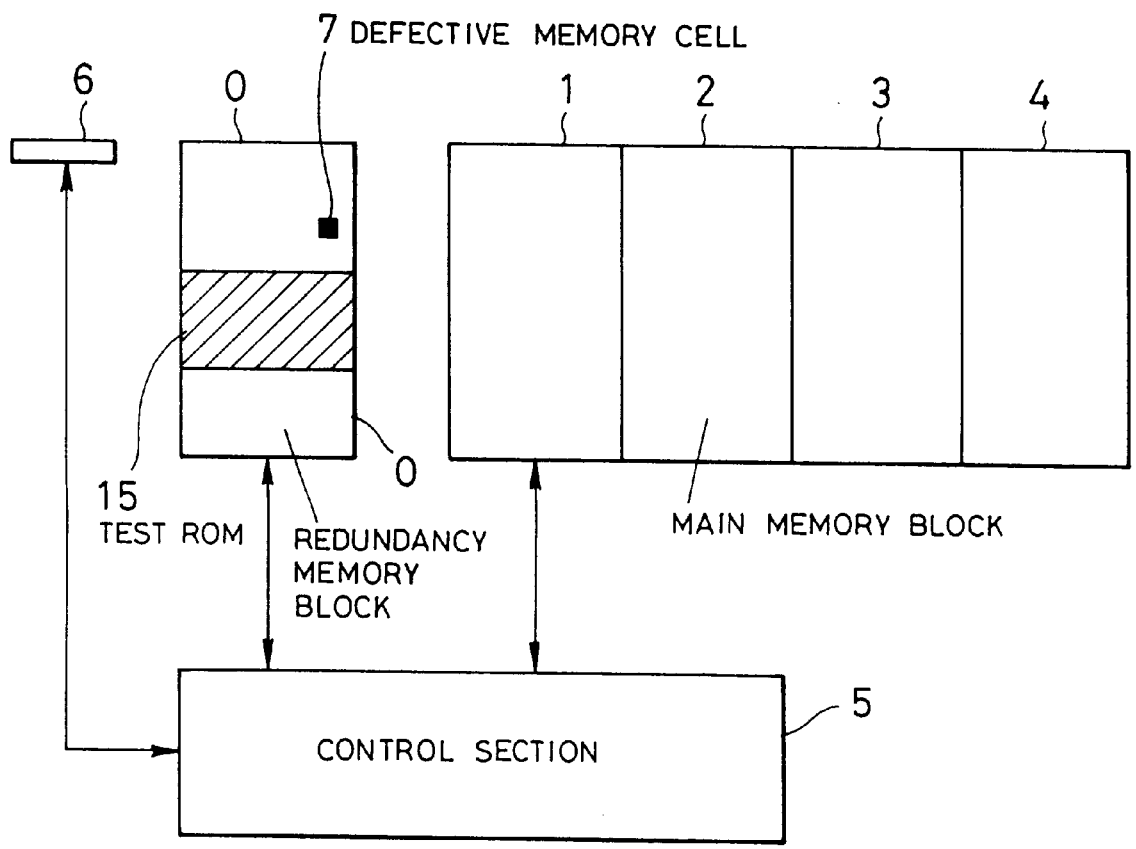
FIG. 2 is a block diagram of the semiconductor memory in the case where a defective memory cell is present in the test ROM.

Now, a description will be made in the case where a defective memory cell is present in the test ROM 15. FIG. 2 is a block diagram of the semiconductor memory in the case where a defective memory cell is present in the test ROM 15.

As shown in the figure, when a defective memory cell 7 is present in the test ROM 15, if the memory area which operates correctly in the redundancy memory block 0 is greater than the memory size of the test ROM 15, an address incorporating the test ROM 15 can be changed to an address which does not include the defective memory cell 7.

The changed address is set to hold by the address memory section 6. The address to be held is one which can determine the location of the test ROM 15 uniquely. For example, it may be the first address alone.

Figure 4:
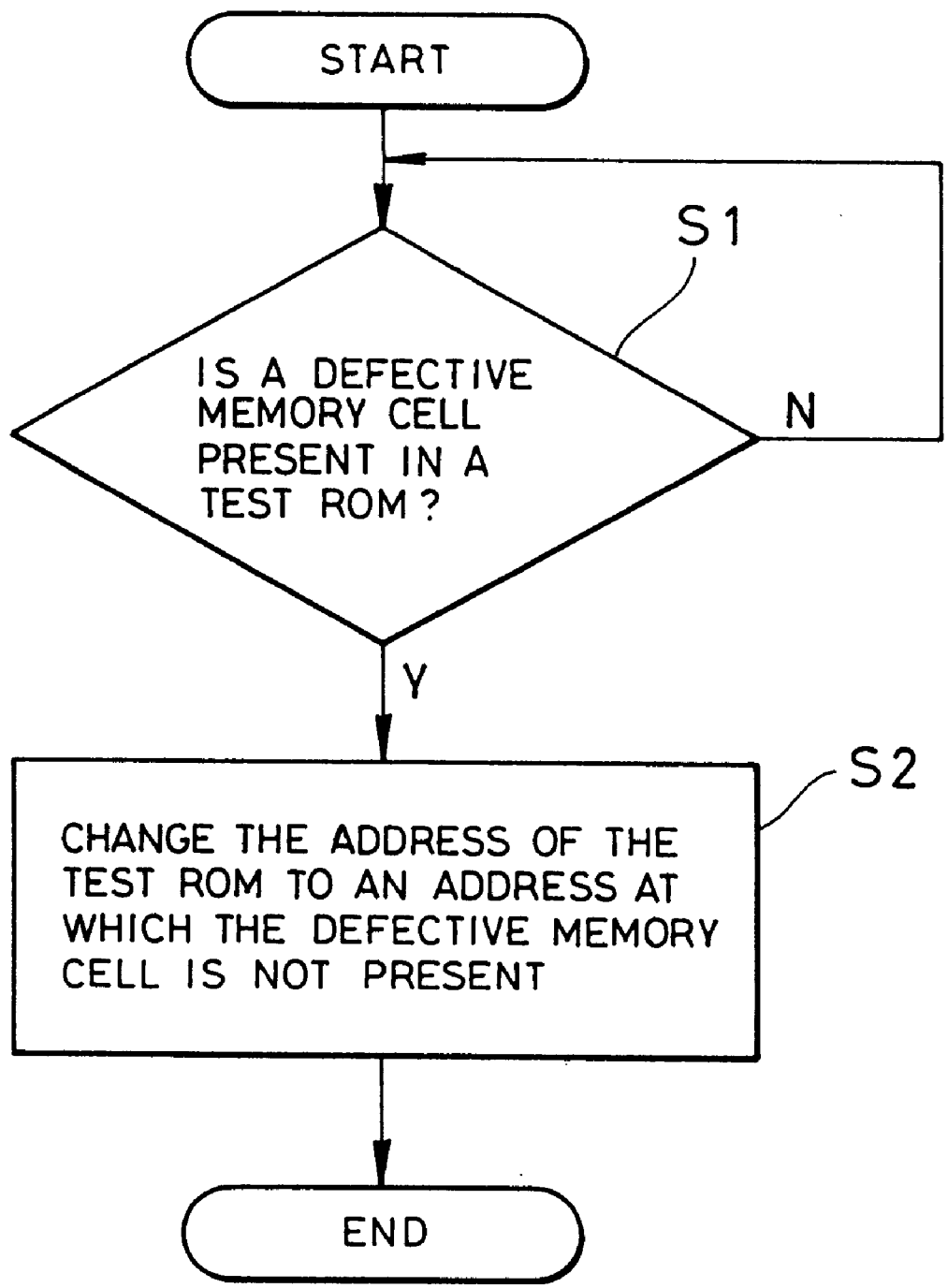
FIG. 4 is a flowchart showing the operation of the control section in the case where there is a defective memory cell in the test ROM.

FIG. 4 is a flowchart showing the operation of the control section in the case where a defective memory cell is present in the test ROM 15.

The control section 5 first judges whether or not a defective memory cell is present in the test ROM 15 (step S1). In the case where the defective memory cell is present, the address of the test ROM 15 is changed to an address at which the defective memory cell 7 within the redundancy memory block 0 is not present (step S2). With this, the operation ends.

On the other hand, in step S1 in the case where there is no defective memory cell, the process waits until a defective memory cell is detected.

Figure 3:
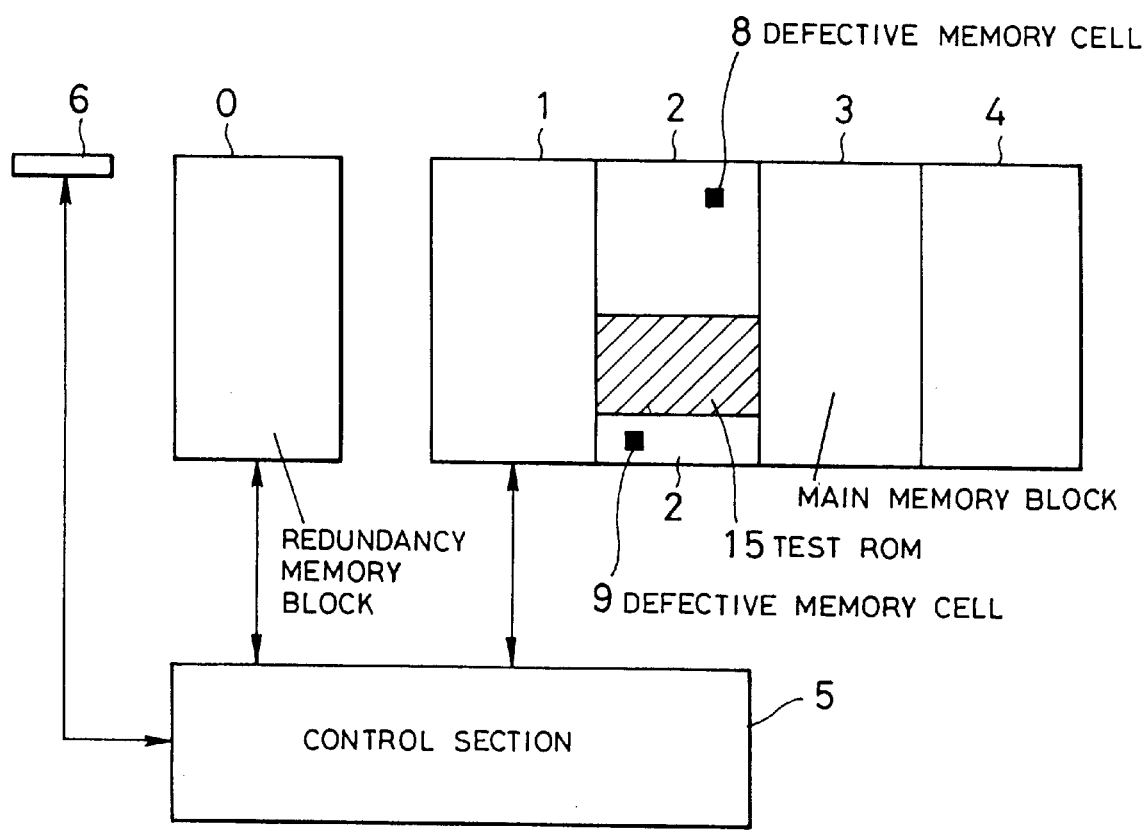
FIG. 3 is a block diagram of the semiconductor memory in the case where a defective memory cell is present within the main memory block.

Next, a description will be made in the case where a defective memory cell is present within the main memory blocks 1 to 4. FIG. 3 is a block diagram of the semiconductor memory in the case where a defective memory cell is present within the main memory blocks 1 to 4.

For instance, assume that defective memory cells 8 and 9 are present within the memory block 2 and the size of the memory which operates correctly is greater than that of the test ROM 15. In this case the memory block 2 is replaced with the redundancy block 0. This replacement is exactly the same as the block switching method in general use.

Next, the addresses of the defective memory cells 8 and 9 within the memory block 2 are found out. Then, the test ROM 15 is moved to an area in which the addresses of the defective memory cells 8 and 9 are not included. The address of the test ROM 15 is held by the address memory section 6. In this manner, the memory area within the memory block 2 which could not be hitherto used can be effectively utilized as the test ROM.

Figure 5:
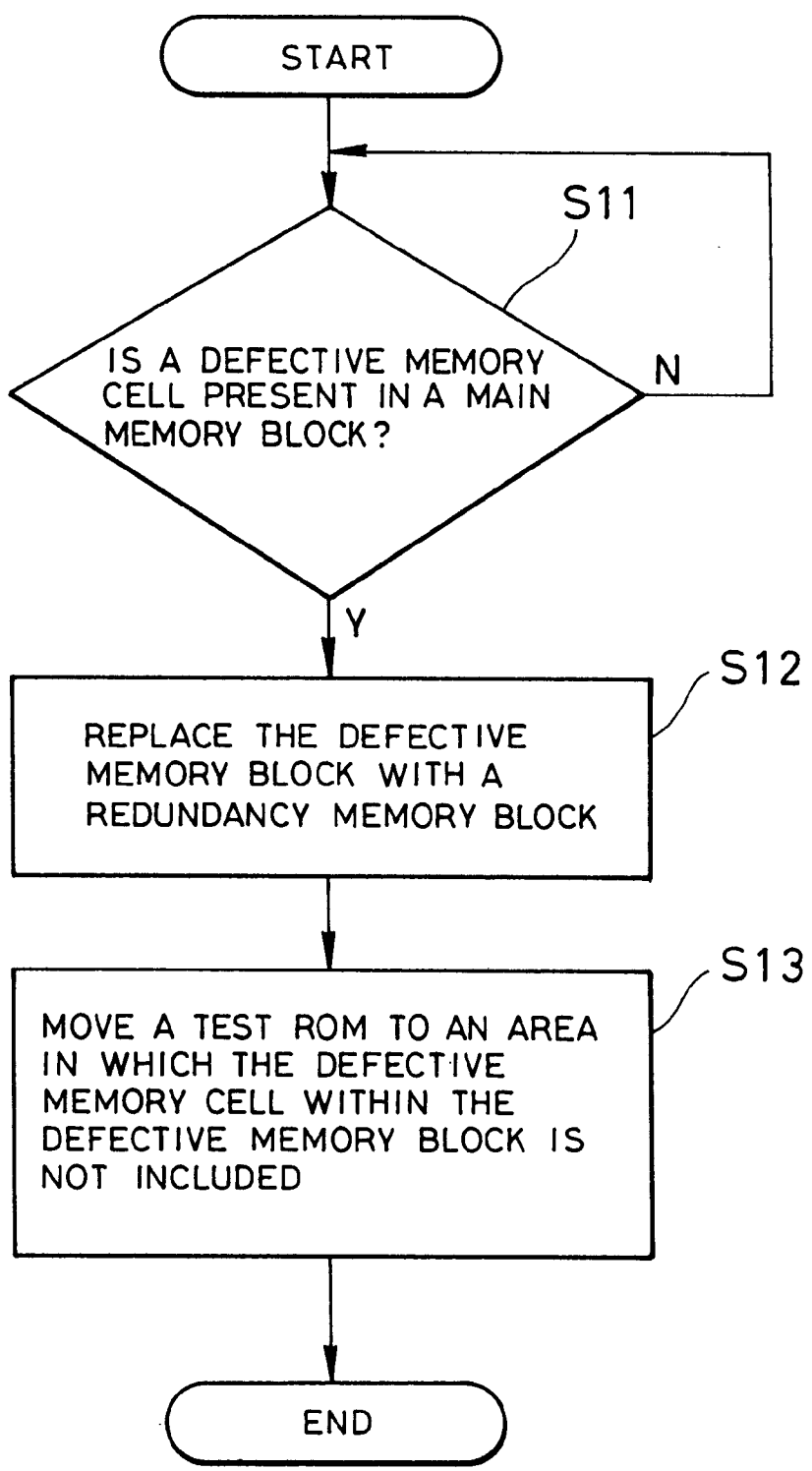
FIG. 5 is a flowchart showing the operation of the control section in the case where a defective memory cell is present within the main memory block.

FIG. 5 is a flowchart showing the operation of the control section 5 in the case where defective memory cells are present within the main memory blocks 1 to 4.

The control section 5 first judges whether or not defective memory cell is present within the main memory blocks 1 to 4 (step S11). Then, if the defective memory cell is present in the main memory block 2, the defective memory block 2 will be replaced with the redundancy memory block 0 (step S12). Next, the test ROM 15 is moved to an area in which the defective memory cells 8 and 9 within the defective memory block 2 are not included (step S13). With this, the operation ends.

On the other hand, in step S11 in the case where there is no defective memory cell, the process waits until a defective memory cell is detected.

According to the present invention, a specific program is stored in the redundancy memory block, so that an increase in the area occupied by the memory can be suppressed. In addition, since the specific program is moved to another area in the main memory block in which no defective memory cell is present, the memory utilization efficiency can be enhanced.

While the invention has been described with reference to the best embodiment thereof, the invention is not to be limited to the details given herein, but may be modified within the scope of the appended claims.

What is claimed is:

1. A memory block replacement system for a semiconductor memory comprising:

a main memory block;

a redundancy memory block;

a specific program written to a certain area within said redundancy memory block; and control means for replacing said main memory block with said redundancy memory block.

2. The memory block replacement system for a semiconductor memory as set forth in claim 1, wherein said control means replaces said main memory block with said redundancy memory block when a defective memory cell is present within said main memory block.

3. The memory block replacement system for a semiconductor memory as set forth in claim 1, wherein said control means includes address setting means which sets an address of said specific program.

4. The memory block replacement system for a semiconductor memory as set forth in claim 3, wherein, when a defective memory cell is present in said area of said redundancy memory block to which said specific program was written, said address setting means moves said specific program to another area within said redundancy memory block in which said defective memory cell is not present.

5. The memory block replacement system for a semiconductor memory as set forth in claim 3, wherein, when a defective memory cell is present in said main memory block which is after replacement with said redundancy memory block and to which said specific program was written, said address setting means moves said specific program to another area within said main memory block in which said defective memory cell is not present.

6. The memory block replacement system for a semiconductor memory as set forth in claim 1, wherein said main memory block consists of a plurality of memory blocks and said control means replaces one of said plurality of memory blocks with said redundancy memory block.

7. The memory block replacement system for a semiconductor memory as set forth in claim 1, wherein said specific program is a test program for testing at least said main memory block and redundancy memory block.

8. The memory block replacement system for a semiconductor memory as set forth in claim 1, wherein said main memory block and redundancy memory block are constituted by non-volatile memory.

9. A memory block replacement method for a semiconductor memory comprising a main memory block, a redundancy memory block, and a specific program written to a certain area within said redundancy memory block, the memory block replacement method including a first process of replacing said main memory block with said redundancy memory block.

10. The memory block replacement method for a semiconductor memory as set forth in claim 9, wherein in said first process said main memory block is replaced with said redundancy memory block when a defective memory cell is present within said main memory block.

11. The memory block replacement method for a semiconductor memory as set forth in claim 9, wherein said first process includes a second process of setting an address of said specific program.

12. The memory block replacement method for a semiconductor memory as set forth in claim 11, wherein, when a defective memory cell is present in said area of said redundancy memory block to which said specific program was written, in said first process, said specific program is moved by said second process to another area within said redundancy memory block in which said defective memory cell is not present.

13. The memory block replacement method for a semiconductor memory as set forth in claim 11, wherein, when a defective memory cell is present in said main memory block which is after replacement with said redundancy memory block and to which said specific program was written, in said first process, said specific program is moved by said second process to another area within said main memory block in which said defective memory cell is not present.

14. The memory block replacement method for a semiconductor memory as set forth in claim 9, wherein said main memory block consists of a plurality of memory blocks and, in said first process, one of said plurality of memory blocks is replaced with said redundancy memory block.

15. The memory block replacement method for a semiconductor memory as set forth in claim 9, wherein said specific program is a test program for testing at least said main memory block and redundancy memory block.

16. The memory block replacement method for a semiconductor memory as set forth in claim 9, wherein said main memory block and redundancy memory block are constituted by non-volatile memory.

* * * * *